(12) United States Patent
Wang et al.

(10) Patent No.: US 11,271,049 B2
(45) Date of Patent: Mar. 8, 2022

(54) ARRAY SUBSTRATE, PREPARATION METHOD THEREOF AND RELATED DEVICE

(71) Applicant: BOE Technology Group Co., Ltd., Beijing (CN)

(72) Inventors: Guoying Wang, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/767,377

(22) PCT Filed: Dec. 20, 2019

(86) PCT No.: PCT/CN2019/127229
§ 371 (c)(1),
(2) Date: May 27, 2020

(87) PCT Pub. No.: WO2020/143433
PCT Pub. Date: Jul. 16, 2020

(65) Prior Publication Data
US 2021/0202600 A1    Jul. 1, 2021

(30) Foreign Application Priority Data
Jan. 8, 2019    (CN) .......................... 201910014900.4

(51) Int. Cl.
*H01L 27/32*    (2006.01)
(52) U.S. Cl.
CPC ...... *H01L 27/3218* (2013.01); *H01L 27/3227* (2013.01); *H01L 27/3262* (2013.01);
(Continued)

(58) Field of Classification Search
CPC ............. H01L 27/3218; H01L 27/3227; H01L 27/3262; H01L 27/3265; H01L 27/3272
(Continued)

(56) References Cited

U.S. PATENT DOCUMENTS

2001/0055008 A1* 12/2001 Young ................. H01L 29/4908
345/204
2006/0012311 A1   1/2006 Ogawa
(Continued)

FOREIGN PATENT DOCUMENTS

| CN | 101521218 A | 9/2009 |
| CN | 102054432 A | 5/2011 |

(Continued)

OTHER PUBLICATIONS

Chinese Office Action corresponding to 201910014900.4 dated May 28, 2020.

*Primary Examiner* — Dzung Tran
(74) *Attorney, Agent, or Firm* — Arent Fox LLP; Michael Fainberg

(57) ABSTRACT

The present disclosure provides an array substrate, a preparation method thereof and a related device. The array substrate includes a plurality of sub-pixel areas, each of the plurality of sub-pixel areas includes a pixel drive circuit and a photo compensation circuit arranged above a substrate, the pixel drive circuit includes a pixel storage capacitor coupled with a drive transistor, and the photo compensation circuit includes a photosensitive storage capacitor coupled with a photosensitive device; and the pixel storage capacitor and the photosensitive storage capacitor are arranged in a laminated manner, and the pixel storage capacitor and the photosensitive storage capacitor share a same electrode plate.

5 Claims, 7 Drawing Sheets

(52) U.S. Cl.
CPC ...... *H01L 27/3265* (2013.01); *H01L 27/3272* (2013.01); *H01L 2227/323* (2013.01)

(58) Field of Classification Search
USPC .......................................................... 257/40
See application file for complete search history.

(56) References Cited

U.S. PATENT DOCUMENTS

| | | | |
|---|---|---|---|
| 2007/0046593 A1* | 3/2007 | Shin | G09G 3/3233 345/81 |
| 2011/0102305 A1 | 5/2011 | Tamura et al. | |
| 2011/0165727 A1* | 7/2011 | Weng | H01L 31/153 438/98 |
| 2015/0041628 A1 | 2/2015 | Goh et al. | |
| 2015/0243217 A1 | 8/2015 | Park et al. | |
| 2018/0053032 A1 | 2/2018 | Ding et al. | |
| 2018/0308869 A1* | 10/2018 | Suzumura | G02F 1/136209 |
| 2019/0096920 A1* | 3/2019 | Zhou | H01L 27/127 |
| 2019/0214448 A1 | 7/2019 | Hu et al. | |
| 2019/0363102 A1* | 11/2019 | Okabe | H01L 29/78678 |
| 2020/0212137 A1 | 7/2020 | Wang et al. | |

FOREIGN PATENT DOCUMENTS

| | | |
|---|---|---|
| CN | 106057821 A | 10/2016 |
| CN | 107316884 A | 11/2017 |
| CN | 107425038 A | 12/2017 |
| CN | 107785399 A | 3/2018 |
| CN | 108230997 A | 6/2018 |
| CN | 108649059 A | 10/2018 |
| CN | 108877653 A | 11/2018 |
| CN | 109742113 A | 5/2019 |
| JP | 2006030317 A | 2/2006 |

* cited by examiner

US 11,271,049 B2

ARRAY SUBSTRATE, PREPARATION METHOD THEREOF AND RELATED DEVICE

CROSS REFERENCE TO RELATED APPLICATIONS

The present disclosure is a national stage application of International Application No. PCT/CN2019/127229, filed Dec. 20, 2019, which claims the priority of Chinese Patent Application No. 201910014900.4, filed with Chinese Patent Office on Jan. 8, 2019, and entitled "Array Substrate, Preparation Method Thereof and Related Device", both of which are hereby incorporated by reference in their entireties.

FIELD

The present disclosure relates to the field of display technology, in particular to an array substrate, a preparation method thereof and a related device.

BACKGROUND

Owing to its own characteristics, OLED (Organic Light Emitting Diode) display devices are widely applied. At present, the compensation of brightness and uniformity of OLED display pictures is mainly based on electrical compensation, including internal compensation and external compensation, or a combination of the two compensation solutions can be adopted. However, through electrical compensation, only display Mura caused by a change of a threshold voltage driving a TFT and a change of mobility can be compensated, while uneven display caused by a change in luminous efficiency of the OLED device itself cannot be compensated. In the existing photo compensation solution, photo compensation is performed on the whole panel once before the panel is delivered, however, Mura caused by attenuation of EL efficiency cannot be solved, i.e., real-time compensation similar to electrical compensation cannot be realized. In addition, a pixel storage capacitor of the pixel driven TFT occupies most of the area of the layout design, such that the aperture ratio of the pixel is relatively low.

SUMMARY

An embodiment of the present disclosure provides an array substrate, including a plurality of sub-pixel areas, where each of the plurality of sub-pixel areas includes a pixel drive circuit arranged above a substrate, and a photo compensation circuit arranged above the substrate, the pixel drive circuit includes a drive transistor, and a pixel storage capacitor coupled with the drive transistor, and the photo compensation circuit includes a photosensitive device, and a photosensitive storage capacitor coupled with the photosensitive device; and the pixel storage capacitor and the photosensitive storage capacitor are arranged in a laminated manner, and the pixel storage capacitor and the photosensitive storage capacitor share a same electrode plate.

Optionally, during specific implementation, in the above array substrate provided in an embodiment of the present disclosure, the photosensitive device in the photo compensation circuit is arranged between the photosensitive storage capacitor and the substrate; and the pixel storage capacitor is arranged on the photosensitive storage capacitor facing away from the substrate;

a light-shielding metal layer is arranged between the photosensitive device and the substrate, where an orthographic projection of the light-shielding metal layer on the substrate covers an orthographic projection of the photosensitive device on the substrate.

Optionally, during specific implementation, in the above array substrate provided in an embodiment of the present disclosure, the photosensitive storage capacitor includes a first electrode, an insulating dielectric layer and a second electrode, where the first electrode, the insulating dielectric layer, and the second electrode are arranged on the photosensitive device in sequence in a laminated manner; and the pixel storage capacitor includes the second electrode, an insulating buffer layer and a third electrode, where the second electrode, the insulating buffer layer, and the third electrode are arranged in sequence in a laminated manner.

Optionally, during specific implementation, in the above array substrate provided in the embodiment of the present disclosure, the photo compensation circuit further includes a photo compensation control transistor arranged on the insulating buffer layer; and where a source of the photo compensation control transistor is electrically coupled with the light-shielding metal layer, and is electrically coupled with the second electrode, or a drain of the photo compensation control transistor is electrically coupled with the light-shielding metal layer, and is electrically coupled with the second electrode.

Optionally, during specific implementation, in the above array substrate provided in the embodiment of the present disclosure, the photo compensation control transistor is a top-gate transistor; and an orthographic projection of the light-shielding metal layer on the substrate covers an orthographic projection of an active layer of the photo compensation control transistor on the substrate.

Optionally, during specific implementation, in the above array substrate provided in the embodiment of the present disclosure, the third electrode and the active layer of the photo compensation control transistor are arranged in a same layer.

Optionally, during specific implementation, in the above array substrate provided in the embodiment of the present disclosure, the pixel drive circuit further includes a drive thin film transistor, and a gate of the drive thin film transistor is electrically coupled with the third electrode.

Correspondingly, an embodiment of the present disclosure further provides a bottom-emitting OLED display panel, including the above array substrate provided in the embodiment of the present disclosure.

Correspondingly, an embodiment of the present disclosure further provides a display device, including the above bottom-emitting OLED display panel provided in an embodiment of the present disclosure.

Correspondingly, an embodiment of the present disclosure further provides a preparation method of the array substrate, including:

forming a light-shielding metal layer on a substrate;

forming a photosensitive device on the light-shielding metal layer;

forming a photosensitive storage capacitor on the photosensitive device, wherein the photosensitive storage capacitor includes a first electrode, an insulating dielectric layer and a second electrode, where the first electrode, the insulating dielectric layer, and the second electrode are arranged in sequence in a laminated manner;

forming an insulating buffer layer on the photosensitive storage capacitor; and forming an active layer of a photo compensation control transistor and a third electrode on the insulating buffer layer, wherein the second electrode, the insulating buffer layer and the third electrode constitute a pixel storage capacitor; and forming a gate, a source and a drain of the photo compensation control transistor in sequence.

DETAILED DESCRIPTION OF THE EMBODIMENTS

Figure 1:
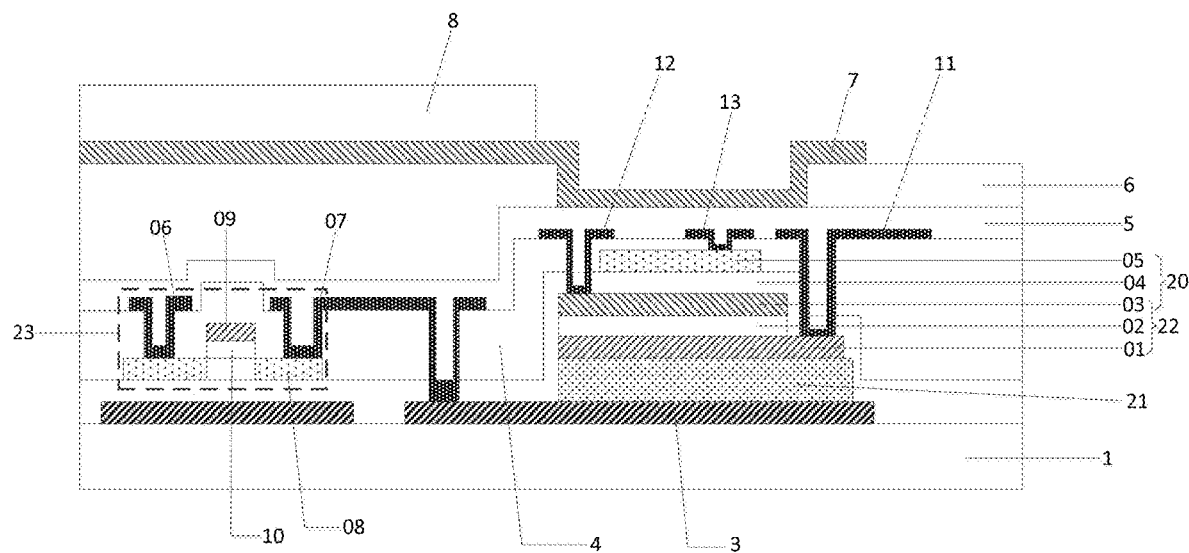
FIG. 1 is a structural schematic diagram of a cross-section of an array substrate provided in an embodiment of the present disclosure.

In order to make the objectives, technical solutions, and advantages of the present disclosure clearer, the present disclosure will be described in detail below in combination with accompanying drawings. Apparently, the described embodiments are only a part but not all of the embodiments of the present disclosure. Based upon the embodiments of the present disclosure, all of the other embodiments obtained by those skilled in the art without any creative effort shall all fall within the protection scope of the present disclosure.

The shape and size of each part in the drawings do not reflect true proportions, merely aiming at schematically illustrating the content of the present disclosure.

Figure 8:
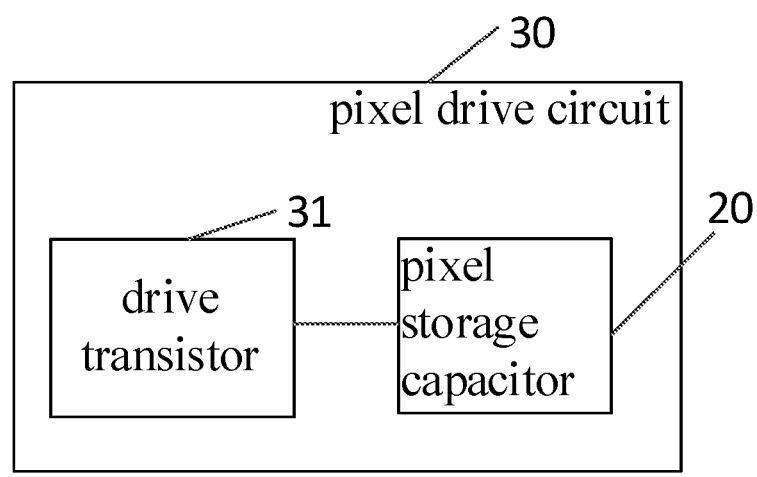
FIG. 8 is a schematic diagram of a pixel drive circuit provided in an embodiment of the present disclosure.

As shown in FIGS. 1 and 8, an array substrate provided in an embodiment of the present disclosure includes a plurality of sub-pixel areas, wherein each of the sub-pixel areas includes a pixel drive circuit 30 and a photo compensation circuit 2 arranged above a substrate 1. In FIG. 1 of the present disclosure, one of the sub-pixel areas is taken as an example for illustration. The pixel drive circuit 30 includes a pixel storage capacitor 20 coupled with a drive transistor 31 (shown in FIG. 8, but not shown in FIG. 1), and the photo compensation circuit 2 includes a photosensitive storage capacitor 22 coupled with a photosensitive device 21; and the pixel storage capacitor 20 and the photosensitive storage capacitor 22 are arranged in a laminated manner, and the pixel storage capacitor 20 and the photosensitive storage capacitor 22 share a same electrode plate.

An array substrate provided in an embodiment of the present disclosure includes a plurality of sub-pixel areas. Each of the sub-pixel areas includes a pixel drive circuit and a photo compensation circuit arranged above a substrate. The pixel drive circuit includes a pixel storage capacitor coupled with a drive transistor, and the photo compensation circuit includes a photosensitive storage capacitor coupled with a photosensitive device. The pixel storage capacitor and the photosensitive storage capacitor are arranged in a laminated manner, and the pixel storage capacitor and the photosensitive storage capacitor share a same electrode plate. In the present disclosure, the photosensitive device, the photosensitive storage capacitor and the pixel storage capacitor are arranged in sequence in a laminated manner along a direction deviating from the substrate, i.e., the orthographic projections of the photosensitive device, the photosensitive storage capacitor and the pixel storage capacitor on the substrate have an overlapping area, thereby reducing the area occupied by the pixel storage capacitor in the sub-pixel area, correspondingly increasing the area of the luminous area, and further improving the aperture ratio of the sub-pixel area.

Optionally, during specific implementation, in the above array substrate provided in an embodiment of the present disclosure, as shown in FIG. 1, the photosensitive device 21 in the photo compensation circuit 2 is arranged between the photosensitive storage capacitor 22 and the substrate 1; and the pixel storage capacitor 20 is arranged on a side, deviating from the substrate 1, of the photosensitive storage capacitor 22.

A light-shielding metal layer 3 is arranged between the photosensitive device 21 and the substrate 1, and an orthographic projection of the light-shielding metal layer 3 on the substrate 1 covers an orthographic projection of the photosensitive device 21 on the substrate 1. In the embodiment of the present disclosure, through preparing the photosensitive device 21 on the light-shielding metal layer 3, the light-shielding metal layer 3 can play a role in the protection of the photosensitive device 21, thereby avoiding influence of the ambient light emitted from a non-sub-pixel area on the photosensitive device 21, improving photosensitive accuracy of the photosensitive device 21, and further improving photo compensation precision.

In the above array substrate provided in an embodiment of the present disclosure, the materials of the light-shielding metal layer can be commonly used metal materials like Mo, Al, Ti, Au, Cu, Hf and Ta, and can also be alloy materials likes AlNd and MoNb.

Optionally, during specific implementation, in the above array substrate provided in an embodiment of the present disclosure, as shown in FIG. 1, the photosensitive storage capacitor 22 includes a first electrode 01, an insulating dielectric layer 02 and a second electrode 03 which are arranged on the photosensitive device 21 in sequence in a laminated manner; and the pixel storage capacitor 20 includes the second electrode 03, an insulating buffer layer 04 and a third electrode 05 which are arranged in sequence in a laminated manner.

In the above array substrate provided in an embodiment of the present disclosure, as shown in FIG. 1, since the photosensitive device 21 is used for brightness detection, in order to keep the first electrode 01, the second electrode 03 and the third electrode 05 from influencing the accuracy of brightness detection of the photosensitive device 21, the materials of the first electrode 01, the second electrode 03 and the third electrode 05 are all transparent conducting materials, for example, the materials of the first electrode 01, the second electrode 03 and the third electrode 05 can all be indium tin oxide (ITO) or indium-doped zinc oxide (IZO), etc.

Optionally, the material of the insulating dielectric layer can be silicon oxide, silicon nitride, silicon oxynitride and other insulating materials.

Optionally, the material of the insulating buffer layer can be silicon oxide, silicon nitride, silicon oxynitride and other insulating materials.

Figure 3:
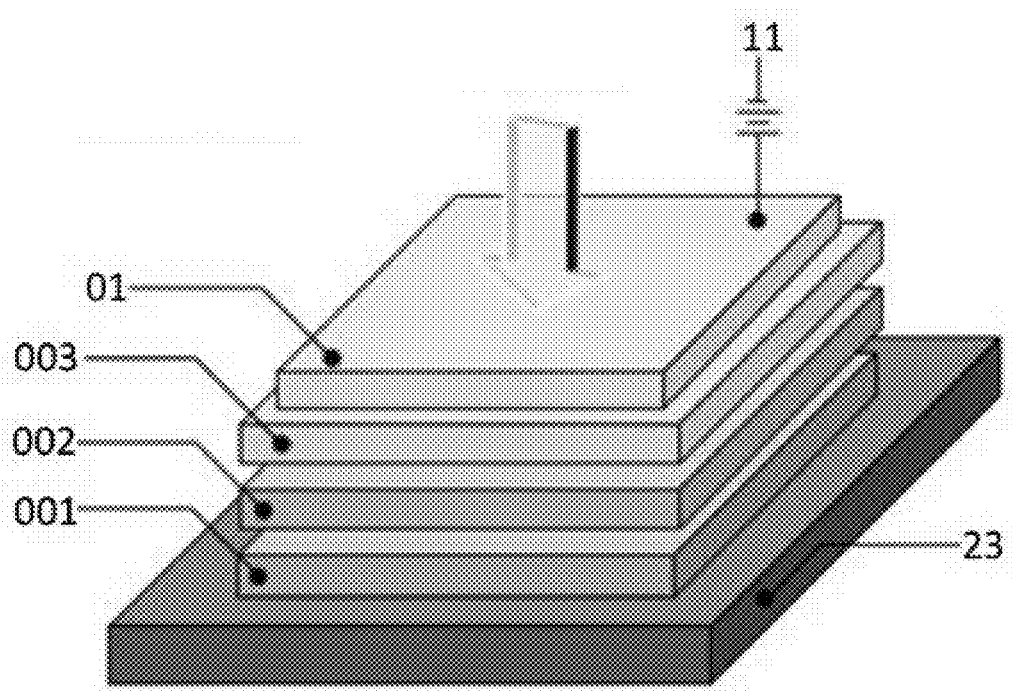
FIG. 3 is a structural schematic diagram of a photosensitive device provided in an embodiment of the present disclosure.
Figure 4:
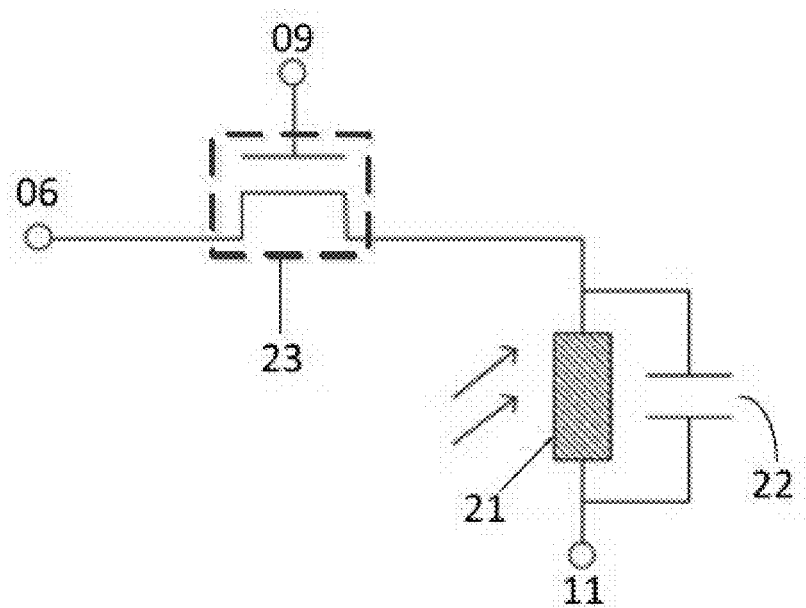
FIG. 4 is a schematic diagram of equivalent circuits of a photosensitive device, a photosensitive storage capacitor and a photo compensation control transistor provided in an embodiment of the present disclosure.

Optionally, during specific implementation, in the above array substrate provided in the embodiment of the present disclosure, as shown in FIG. 3, the photosensitive device 21 can include an N-type semiconductor layer 001, an intrinsic semiconductor layer 002 and a P-type semiconductor layer 003 which are arranged in a laminated manner on a side deviating from the substrate 1. The N-type semiconductor layer 001 is electrically coupled with a drain of the photo compensation control transistor 23, the P-type semiconductor layer 003 is electrically coupled with the first electrode 01, and the first electrode 01 is connected with the signal line 11. The equivalent circuit diagram of the photosensitive device 21, the photosensitive storage capacitor 22 and the photo compensation control transistor 23 is as shown in FIG. 4. Specifically, the N-type semiconductor layer can be a phosphorus-doped or arsenic-doped semiconductor, and the P-type semiconductor layer can be a boron-doped semiconductor.

During specific implementation, as shown in FIG. 1, the above array substrate provided in the embodiment of the present disclosure further includes a signal line 11 electrically coupled with the first electrode 01, the signal line 11 is electrically coupled with the first electrode 01 through a via hole which penetrates through the insulating buffer layer 04 and an interlayer dielectric layer 4, and the signal line 11 can provide a low voltage, for example, the supplied low voltage can be −5V.

Optionally, during specific implementation, in the above array substrate provided in the embodiment of the present disclosure, as shown in FIG. 1, the photo compensation circuit 2 further includes a photo compensation control transistor 23 arranged on the insulating buffer layer 04. A source 06 or a drain 07 of the photo compensation control transistor 23 is electrically coupled with the light-shielding metal layer 3, and is electrically coupled with the second electrode 03. It should be noted that, the embodiments of the present disclosure are all schematically illustrated with the drain 07 of the photo compensation control transistor 23 being electrically coupled with the light-shielding metal layer 3 as an example. Specifically, the drain 07 is electrically coupled with the second electrode 03 through a first coupling part 12 which is filled in the via hole penetrating through the insulating buffer layer 04 and the interlayer dielectric layer 4.

Optionally, during specific implementation, in the above array substrate provided in the embodiment of the present disclosure, as shown in FIG. 1, the photo compensation control transistor 23 is a top-gate transistor; and an orthographic projection of the light-shielding metal layer 3 on the substrate 1 covers an orthographic projection of an active layer 08 of the photo compensation control transistor 23 on the substrate 1. The light-shielding metal layer 3 can block the light from irradiating onto the active layer 08 of the photo compensation control transistor 23, thereby playing a role in the protection of the active layer 08 of the photo compensation control transistor 23, avoiding influence of the light on the active layer 08 of the photo compensation control transistor 23, and further improving stability of the photo compensation control transistor 23.

Optionally, the material of the active layer 08 can include amorphous indium gallium zinc oxide (a-IGZO), zinc oxide (ZnO:N), indium zinc tin oxide (IZTO), amorphous silicon (a-Si), polycrystalline silicon (p-Si), sexithiophene, polythiophene and other materials.

Optionally, during specific implementation, to reduce preparation processes, in the above array substrate provided in the embodiment of the present disclosure, as shown in FIG. 1, the third electrode 05 is arranged to be in the same layer as the active layer 08 of the photo compensation control transistor 23. The material of the third electrode 05 can be metal oxide materials, such as indium gallium zinc oxide (IGZO) materials.

Optionally, during specific implementation, in the above array substrate provided in the embodiment of the present disclosure, as shown in FIG. 1, the pixel drive circuit further includes a drive thin film transistor (not shown in FIG. 1), and a gate of the drive thin film transistor is electrically coupled with the third electrode 05 through a second coupling part 13 which is filled in the via hole penetrating through the interlayer dielectric layer 4.

During specific implementation, as shown in FIG. 1, in the embodiment of the present disclosure, through preparing the photosensitive device 21 on the light-shielding metal layer 3, the light-shielding metal layer 3 can play a role in the protection of the photosensitive device 21, thereby avoiding influence of the ambient light on the photosensitive device 21, improving photosensitive accuracy of the photosensitive device 21, and further improving photo compensation precision. Then a photosensitive storage capacitor 22 is prepared on the photosensitive device 21, an insulating buffer layer 04 is prepared on the photosensitive storage capacitor 22, a photo compensation control transistor 23, a third electrode 05 and a signal line 11 are prepared on the insulating buffer layer 04, and the drain 07 of the photo compensation control transistor 23 is electrically coupled with the light-shielding metal layer 3. Since the photosensitive device 21 is arranged on the light-shielding metal layer 3, i.e., the drain 07 of the photo compensation control transistor 23 is electrically coupled with the photosensitive device 21, the N-type semiconductor layer of the photosensitive device 21 is formed on the light-shielding metal layer 3, and the light-shielding metal layer 3 is connected with the drain 07 of the photo compensation control transistor 23, then the light-shielding metal layer 3 can serve as an N-terminal electrode of the photosensitive device 21 to be connected with the photo compensation control transistor 23, and the P-type semiconductor layer of the photosensitive device 21 can serve as a P-terminal electrode of the photosensitive device 21 to be coupled with the signal line 11.

Figure 2:
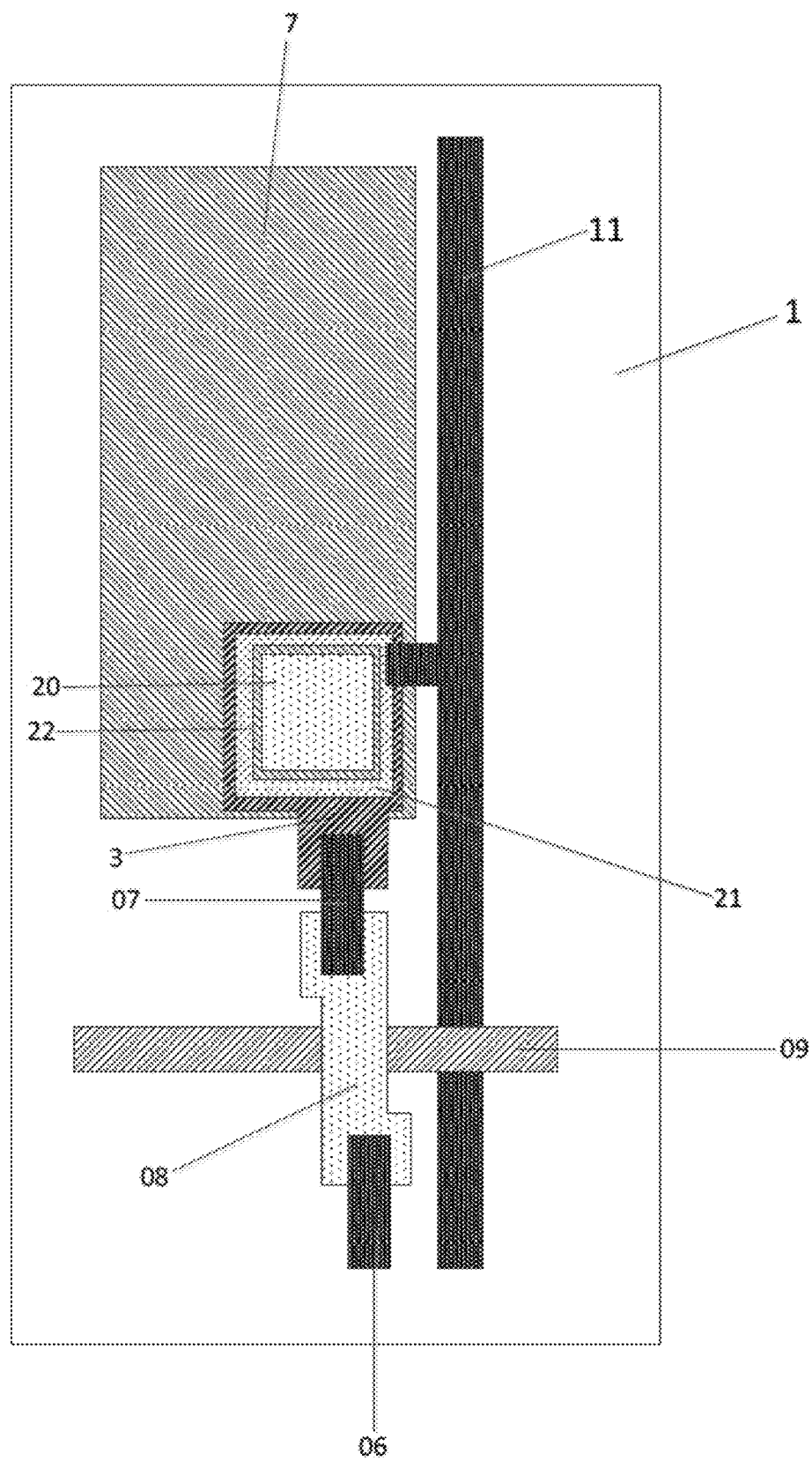
FIG. 2 is a structural schematic diagram of a top view structure of the array substrate shown in FIG. 1.

As shown in FIG. 2 which is a schematic diagram of a top view of the array substrate shown in FIG. 1, it is illustrated that, the photosensitive storage capacitor 22 and the pixel storage capacitor 20 are arranged in a laminated manner, thereby reducing the area occupied by the pixel storage capacitor 20, and further improving the aperture ratio of the pixel.

In summary, as to the above array substrate provided in the embodiment of the present disclosure, a photo compensation circuit is arranged at each sub-pixel area, the photo compensation circuit includes a photo compensation control transistor, a photosensitive storage capacitor and a photosensitive device, and the overall structure of the photosensitive storage capacitor and the photosensitive device is an optical detection device. The optical detection device is electrically coupled with the source or the drain in the photo compensation control transistor, the brightness of light emitted from the sub-pixel area can be detected through the optical detection device, the detection results of light brightness is output through the photo compensation control transistor, and then the brightness of the sub-pixel area can be compensated according to the detection results of light brightness, thereby performing real-time brightness compensation on the sub-pixel after the delivery of the OLED display panel on which the array substrate is located, and effectively alleviating poor display caused by a change in brightness of the OLED display panel. Moreover, in the embodiment of the present disclosure, a photosensitive device and a photosensitive storage capacitor are firstly prepared, and the photo compensation control transistor is then prepared after an insulating buffer layer is formed on the photosensitive storage capacitor, then the photosensitive device and the photosensitive storage capacitor are protected by the insulating buffer layer, so an etching process in the subsequent process of preparing the photo compensation control transistor will not damage a side wall of the photosensitive device, furthermore, an insulating buffer layer isolates the photosensitive device from the photo compensation control transistor, when the photo compensation control transistor is prepared, hydrogen introduced in the process of preparing the photosensitive device can be kept from influencing the photo compensation control transistor, thereby improving reliability of the array substrate.

Optionally, during specific implementation, in the above array substrate provided in an embodiment of the present disclosure, as shown in FIG. 1, the photo compensation control transistor 23 further includes a gate insulating layer 10 and a gate 09, the material of the gate insulating layer 10 can be silicon oxide, silicon nitride, silicon oxynitride and other insulating materials; and the material of the gate 09 can be commonly used metal materials like Mo, Al, Ti, Au, Cu, Hf and Ta, and can also be MoNd, Cu, or MoNd alloy materials.

Optionally, during specific implementation, in the above array substrate provided in an embodiment of the present disclosure, as shown in FIG. 1, the array substrate further includes a passivation layer 5, a planarization layer 6, an anode layer 7 and a pixel defining layer 8. The functions and structures of these film layers are the same as those in the prior art, and will not be described in detail herein.

Figure 5:
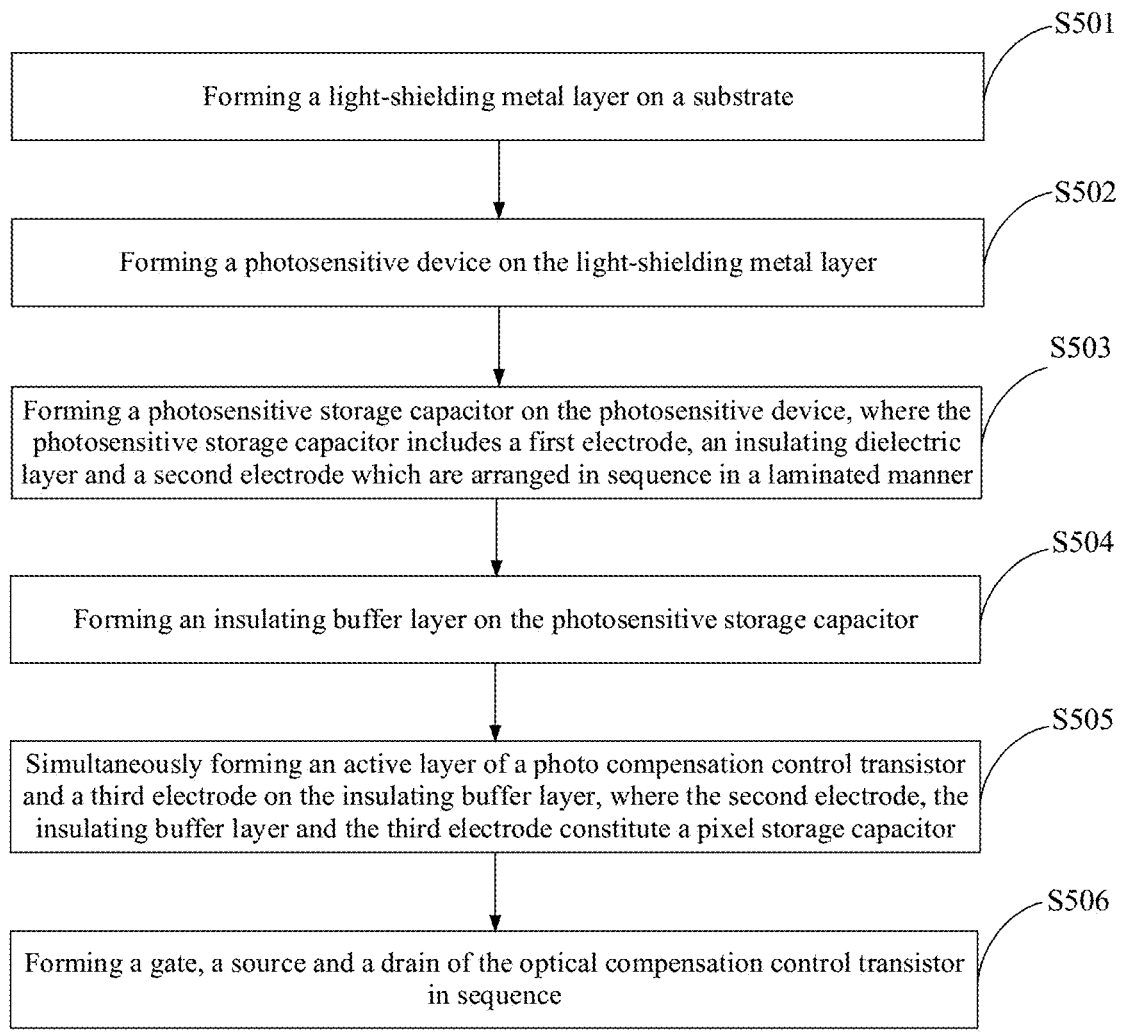
FIG. 5 is a flow diagram of a preparation method of the array substrate provided in an embodiment of the present disclosure.

Based on the same inventive concept, an embodiment of the present disclosure further provides a preparation method of an array substrate, as shown in FIG. 5, the preparation method includes:

S501, forming a light-shielding metal layer on a substrate;

S502, forming a photosensitive device on the light-shielding metal layer;

S503, forming a photosensitive storage capacitor on the photosensitive device, where the photosensitive storage capacitor includes a first electrode, an insulating dielectric layer and a second electrode which are arranged in sequence in a laminated manner;

S504, forming an insulating buffer layer on the photosensitive storage capacitor;

S505, simultaneously forming an active layer of a photo compensation control transistor and a third electrode on the insulating buffer layer, where the second electrode, the insulating buffer layer and the third electrode constitute a pixel storage capacitor; and S506, forming a gate insulating layer, a gate, a source and a drain of the optical compensation control transistor above the active layer of the photo compensation control transistor in sequence.

In the preparation method of the above array substrate provided in the embodiment of the present disclosure, the photosensitive device, the photosensitive storage capacitor and the pixel storage capacitor are arranged in sequence in a laminated manner along a direction deviating from the substrate, i.e., the orthographic projections of the photosensitive device, the photosensitive storage capacitor and the pixel storage capacitor on the substrate have an overlapping area, thereby reducing the area occupied by the pixel storage capacitor in the sub-pixel area, correspondingly increasing the area of the luminous area, and further improving the aperture ratio of the sub-pixel area. Moreover, the photosensitive device and the photosensitive storage capacitor are prepared before the photo compensation control transistor is prepared, and an insulating buffer layer is formed on the photosensitive storage capacitor, so an etching process in the subsequent process of preparing the photo compensation control transistor will not damage a side wall of the photosensitive device, furthermore, an insulating buffer layer isolates the photosensitive device from the photo compensation control transistor, when the photo compensation control transistor is prepared, hydrogen introduced in the process of preparing the photosensitive device can be kept from influencing the photo compensation control transistor, thereby improving reliability of the array substrate.

Figure 6A:
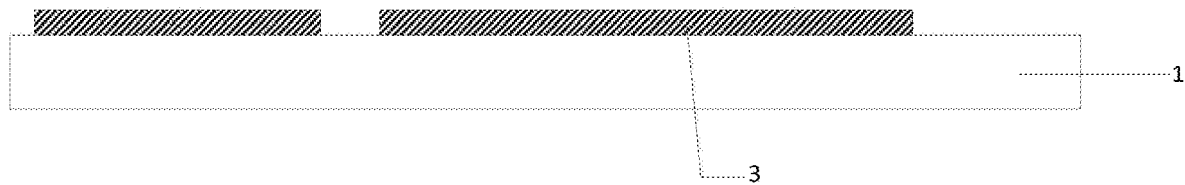
FIG. 6A to FIG. 6F are respectively structural schematic diagrams of the structure after execution of each step in the method of preparing the array substrate shown in FIG. 1.
Figure 6B:
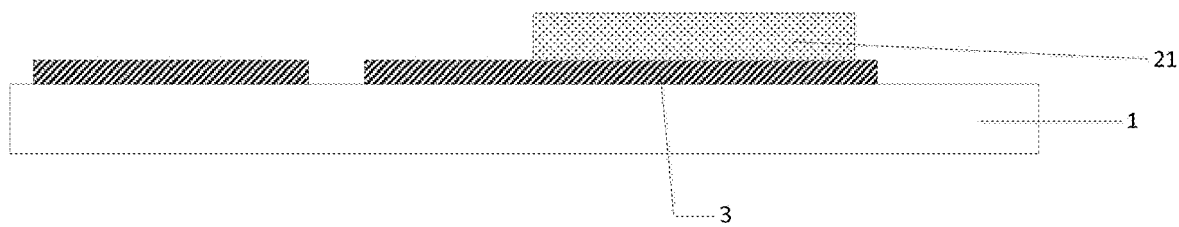
Figure 6C:
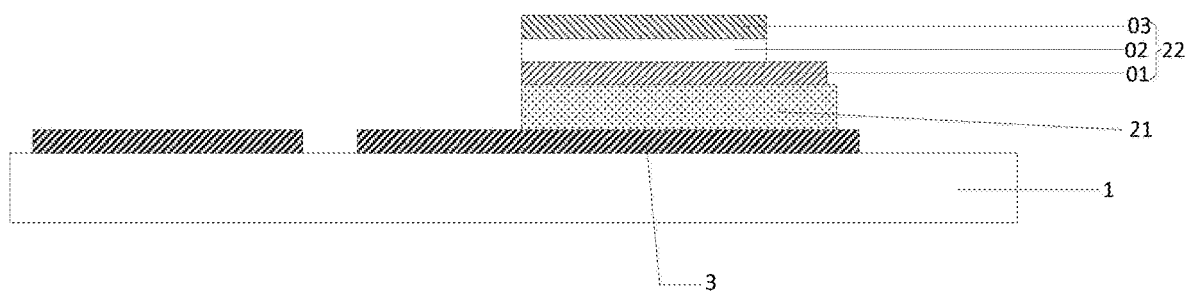
Figure 6D:
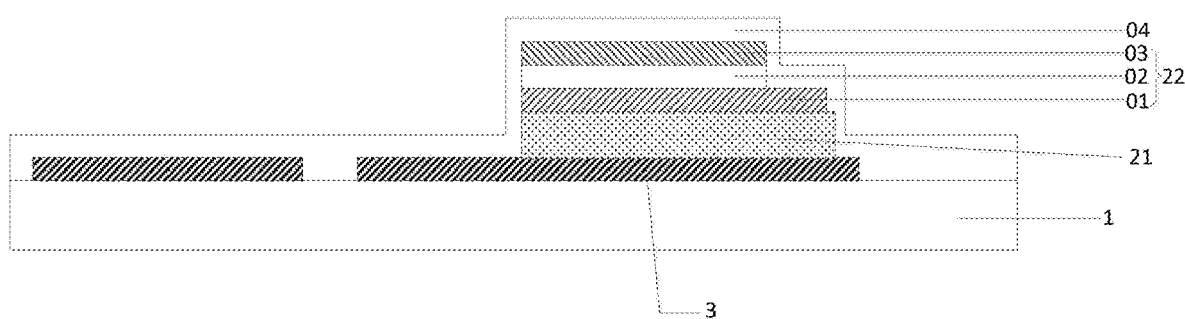
Figure 6E:
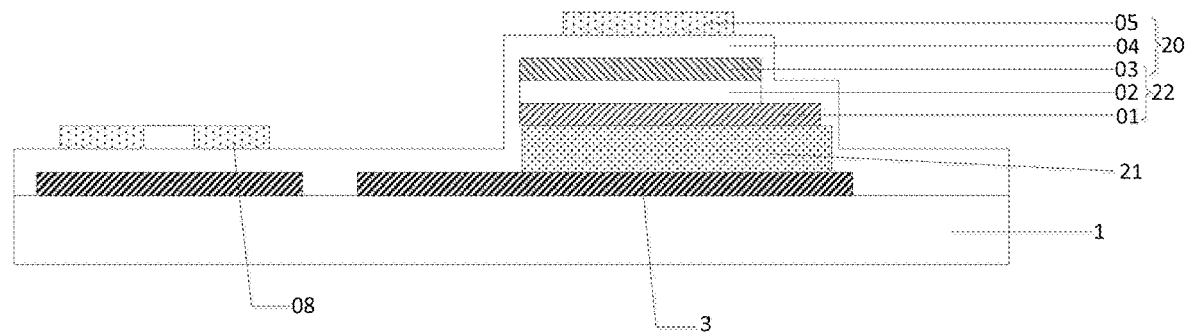
Figure 6F:
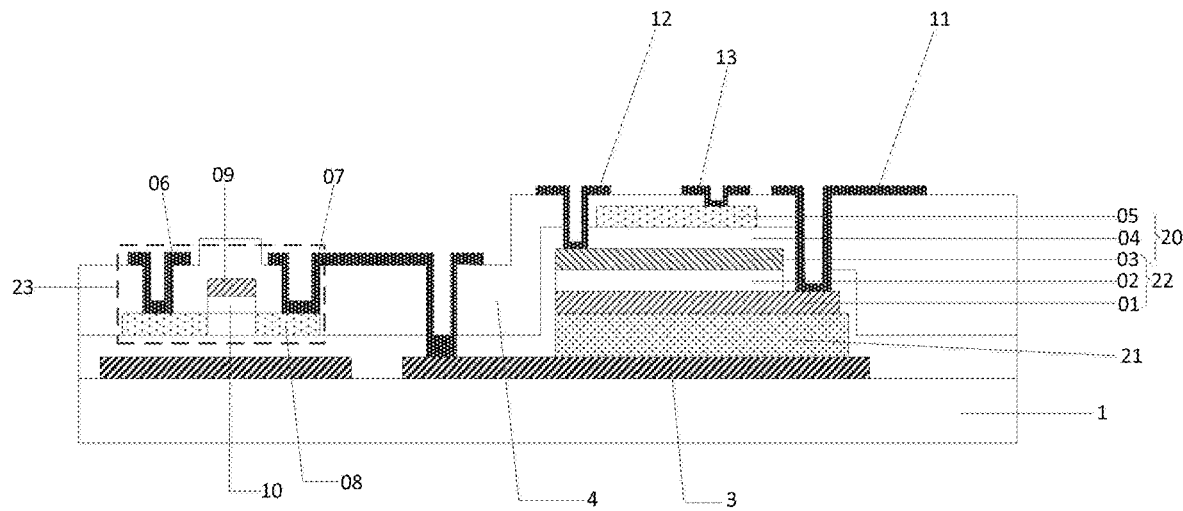

The preparation method of the array substrate shown in FIG. 1 provided in the embodiment of the present disclosure will be described in detail below through specific examples. As shown in FIG. 6A to FIG. 6F, the preparation method specifically includes the following steps:

(1) forming a light-shielding metal layer 3 on the substrate 1, as shown in FIG. 6A;

(2) forming a photosensitive device 21 on the light-shielding metal layer 3, where an orthographic projection of the light-shielding metal layer 3 on the substrate 1 covers an orthographic projection of the photosensitive device 21 on the substrate 1, as shown in FIG. 6B;

(3) forming a photosensitive storage capacitor 22 on the photosensitive device 21, where the photosensitive storage capacitor 22 includes a first electrode 01, an insulating dielectric layer 02 and a second electrode 03 which are arranged in sequence in a laminated manner, as shown in FIG. 6C;

(4) forming an insulating buffer layer 04 on the photosensitive storage capacitor 22, as shown in FIG. 6D;

(5) simultaneously forming an active layer 08 of a photo compensation control transistor 23 and a third electrode 05 on the insulating buffer layer 04, wherein the second electrode 03, the insulating buffer layer 04 and the third electrode 05 constitute a pixel storage capacitor 20, as shown in FIG. 6E;

(6) forming in sequence, above the active layer 08, a gate insulating layer 10, a gate 09, a source 06 and a drain 07 of the optical compensation control transistor 23, a first coupling part 12 in a via hole penetrating through the insulating buffer layer 04 and the interlayer dielectric layer 4, a second coupling part 13 in a via hole penetrating through the interlayer dielectric layer 4, and a signal line 11, where the drain 07 is electrically coupled with the light-shielding metal layer 3 and the first coupling part 12, the second coupling part 13 is electrically coupled with the gate of a drive transistor, and the signal line 11 is electrically coupled with the first electrode 01 through a via hole penetrating through the interlayer dielectric layer 4 and the insulating buffer layer 04, as shown in FIG. 6F; and (7) forming in sequence a passivation layer 5, a planarization layer 6, an anode layer 7 and a pixel defining layer 8 above the structure shown in FIG. 6F, as shown in FIG. 1.

The array substrate shown in FIG. 1 in the embodiment of the present disclosure can be obtained through the above steps (1)-(7).

It should be noted that, for the material of each film layer in the above steps (1)-(7), please refer to the material of each film layer provided in an array substrate provided in the embodiment of the present disclosure, and the materials will not be enumerated in the above preparation method.

During specific implementation, after step (7), the preparation method further includes the preparation of a drive circuit, a filter layer, an organic luminous layer and a cathode. The drive circuit is coupled with the anode layer, and the drive circuit drives the organic luminous layer to emit light towards the side at which the substrate is located. The structures and functions of these film layers are the same as the structures and functions of the same film layers in the prior art, and will not be described in detail herein.

It should be noted that, in the above preparation method provided in the embodiment of the present disclosure, a composition process can only include a photolithographic process, or can include the photolithographic process and an etching step, and can also include other processes for forming predetermined patterns like printing and ink jet; the photolithographic process refers to a process which includes film formation, exposure, developing and other processes and which utilizes photoresist, a mask plate and an exposure machine to form patterns. During specific implementation, corresponding composition processes can be selected according to the structures formed in the present disclosure.

Based on the same inventive concept, an embodiment of the present disclosure further provides a bottom-emitting OLED display panel, including the above array substrate provided in the embodiment of the present disclosure. The array substrate is a back plate of the bottom-emitting OLED display panel, and a cover plate set corresponding to the back plate is further included, and the cover plate can be a glass cover plate.

Based on the same inventive concept, an embodiment of the present disclosure further provides a display device, including the bottom-emitting OLED display panel in the above embodiment. The principle based on which the display device solves problems is similar to that of the above array substrate, therefore, for the implementation of the display device, please refer to the implementation of the above array substrate, and the repeated parts will not be repeated redundantly herein.

During specific implementation, the above display device provided in an embodiment of the present disclosure can be a full-screen display device, or can also be a flexible display device, which is not defined herein.

Figure 7:
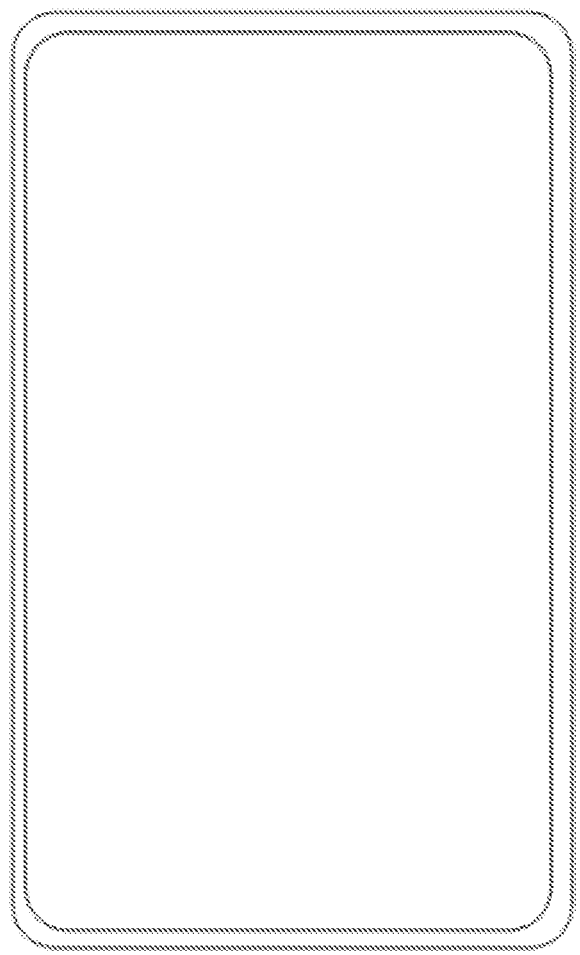
FIG. 7 is a structural schematic diagram of a display device provided in an embodiment of the present disclosure.

During specific implementation, the above display device provided in an embodiment of the present disclosure can also be a full-screen mobile phone as shown in FIG. 7. Of course, the above display device provided in the embodiment of the present disclosure can also be a tablet personal computer, a television, a display, a notebook computer, a digital photo frame, a navigator and any other products or parts with a display function. The other essential components of the display device should be provided as understood by those skilled in the art, are not repeated redundantly herein, and also should not be deemed as a limitation to the present disclosure.

As to the array substrate, the preparation method thereof and the related device provided in the embodiments of the present disclosure, the array substrate includes a plurality of sub-pixel areas, each sub-pixel area includes a pixel drive circuit and a photo compensation circuit arranged above a substrate. The pixel drive circuit includes a pixel storage capacitor coupled with a drive transistor, and the photo compensation circuit includes a photosensitive storage capacitor coupled with a photosensitive device. The pixel storage capacitor and the photosensitive storage capacitor are arranged in a laminated manner, and the pixel storage capacitor and the photosensitive storage capacitor share a same electrode plate. In the present disclosure, the photosensitive device, the photosensitive storage capacitor and the pixel storage capacitor are arranged in sequence in a laminated manner along a direction deviating from the substrate, i.e., the orthographic projections of the photosensitive device, the photosensitive storage capacitor and the pixel storage capacitor on the substrate have an overlapping area, thereby reducing the area occupied by the pixel storage capacitor in the sub-pixel area, correspondingly increasing the area of the luminous area, and further improving the aperture ratio of the sub-pixel area.

Evidently those skilled in the art can make various modifications and variations to the embodiment of the present disclosure without departing from the spirit and scope of the embodiment of the present disclosure. Thus the present disclosure is also intended to encompass these modifications and variations thereto so long as the modifications and variations come into the scope of the claims appended to the present disclosure and their equivalents.

What is claimed is:

1. An array substrate, comprising a plurality of sub-pixel areas, wherein:
   each of the plurality of sub-pixel areas comprises:
      a pixel drive circuit arranged above a substrate, and
      a photo compensation circuit arranged above the substrate; wherein
         the pixel drive circuit comprises a drive transistor, and a pixel storage capacitor coupled with the drive transistor;
         the photo compensation circuit comprises a photosensitive device, and a photosensitive storage capacitor coupled with the photosensitive device; and wherein
            the pixel storage capacitor and the photosensitive storage capacitor are arranged in a laminated manner;
            the pixel storage capacitor and the photosensitive storage capacitor share a same electrode plate;
            the photosensitive device in the photo compensation circuit is arranged between the photosensitive storage capacitor and the substrate;
            the pixel storage capacitor is arranged on the photosensitive storage capacitor facing away from the substrate; and
            a light-shielding metal layer is arranged between the photosensitive device and the substrate, wherein an orthographic projection of the light-shielding metal layer on the substrate covers an orthographic projection of the photosensitive device on the substrate;
            the photosensitive storage capacitor comprises:
               a first electrode,
               an insulating dielectric layer, and
               a second electrode, wherein:
                  the first electrode, the insulating dielectric layer, and the second electrode are arranged on the photosensitive device in sequence in a laminated manner;
            and the pixel storage capacitor comprises:
               the second electrode,
               an insulating buffer layer, and
               a third electrode, wherein:
                  the second electrode, the insulating buffer layer, and the third electrode are arranged in sequence in a laminated manner;

wherein the photo compensation circuit further comprises
a photo compensation control transistor arranged on the insulating buffer layer; and wherein:
a source of the photo compensation control transistor is electrically coupled with the light-shielding metal layer, and is electrically coupled with the second electrode, or
a drain of the photo compensation control transistor is electrically coupled with the light-shielding metal layer, and is electrically coupled with the second electrode.

2. The array substrate of claim 1, wherein
the photo compensation control transistor is a top-gate transistor; and
an orthographic projection of the light-shielding metal layer on the substrate covers an orthographic projection of an active layer of the photo compensation control transistor on the substrate.

3. The array substrate of claim 2, wherein the active layer of the photo compensation control transistor and the third electrode are arranged in a same layer.

4. A bottom-emitting OLED display panel, comprising an array substrate, wherein the array substrate comprises a plurality of sub-pixel areas, wherein:
each of the plurality of sub-pixel areas comprises:
a pixel drive circuit arranged above a substrate, and
a photo compensation circuit arranged above the substrate; wherein
the pixel drive circuit comprises a drive transistor, and a pixel storage capacitor coupled with the drive transistor;
the photo compensation circuit comprises a photosensitive device, and a photosensitive storage capacitor coupled with the photosensitive device; and wherein
the pixel storage capacitor and the photosensitive storage capacitor are arranged in a laminated manner;
the pixel storage capacitor and the photosensitive storage capacitor share a same electrode plate;
the photosensitive device in the photo compensation circuit is arranged between the photosensitive storage capacitor and the substrate;
the pixel storage capacitor is arranged on the photosensitive storage capacitor facing away from the substrate; and
a light-shielding metal layer is arranged between the photosensitive device and the substrate, wherein an orthographic projection of the light-shielding metal layer on the substrate covers an orthographic projection of the photosensitive device on the substrate;
the photosensitive storage capacitor comprises:
a first electrode,
an insulating dielectric layer, and
a second electrode, wherein:
the first electrode, the insulating dielectric layer, and the second electrode are arranged on the photosensitive device in sequence in a laminated manner;
and the pixel storage capacitor comprises:
the second electrode,
an insulating buffer layer, and
a third electrode, wherein:
the second electrode, the insulating buffer layer, and the third electrode are arranged in sequence in a laminated manner;
wherein the photo compensation circuit further comprises
a photo compensation control transistor arranged on the insulating buffer layer; and wherein:
a source of the photo compensation control transistor is electrically coupled with the light-shielding metal layer, and is electrically coupled with the second electrode, or
a drain of the photo compensation control transistor is electrically coupled with the light-shielding metal layer, and is electrically coupled with the second electrode.

5. A display device, comprising a bottom-emitting OLED display panel comprising an array substrate, wherein the array substrate comprises a plurality of sub-pixel areas, wherein:
each of the plurality of sub-pixel areas comprises:
a pixel drive circuit arranged above a substrate, and
a photo compensation circuit arranged above the substrate; wherein
the pixel drive circuit comprises a drive transistor, and a pixel storage capacitor coupled with the drive transistor;
the photo compensation circuit comprises a photosensitive device, and a photosensitive storage capacitor coupled with the photosensitive device; and wherein
the pixel storage capacitor and the photosensitive storage capacitor are arranged in a laminated manner;
the pixel storage capacitor and the photosensitive storage capacitor share a same electrode plate;
the photosensitive device in the photo compensation circuit is arranged between the photosensitive storage capacitor and the substrate;
the pixel storage capacitor is arranged on the photosensitive storage capacitor facing away from the substrate; and
a light-shielding metal layer is arranged between the photosensitive device and the substrate, wherein an orthographic projection of the light-shielding metal layer on the substrate covers an orthographic projection of the photosensitive device on the substrate;
the photosensitive storage capacitor comprises:
a first electrode,
an insulating dielectric layer, and
a second electrode, wherein:
the first electrode, the insulating dielectric layer, and the second electrode are arranged on the photosensitive device in sequence in a laminated manner;
and the pixel storage capacitor comprises:
the second electrode,
an insulating buffer layer, and
a third electrode, wherein:
the second electrode, the insulating buffer layer, and the third electrode are arranged in sequence in a laminated manner;
wherein the photo compensation circuit further comprises
a photo compensation control transistor arranged on the insulating buffer layer; and wherein:
a source of the photo compensation control transistor is electrically coupled with the light-shielding metal layer, and is electrically coupled with the second electrode, or a drain of the photo compensation control transistor is electrically coupled with the light-shielding metal layer, and is electrically coupled with the second electrode.

\* \* \* \* \*